(12) United States Patent
Ouyang et al.

(10) Patent No.: US 8,112,400 B2
(45) Date of Patent: Feb. 7, 2012

(54) METHOD FOR COLLECTING DATA FROM SEMICONDUCTOR EQUIPMENT

(75) Inventors: Bing Ouyang, Plano, TX (US); Gurshaman S. Baweja, Allen, TX (US); Donald J. Rigsby, Jr., Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1834 days.

(21) Appl. No.: 10/746,658

(22) Filed: Dec. 23, 2003

(65) Prior Publication Data

US 2005/0138075 A1 Jun. 23, 2005

(51) Int. Cl.
*G06F 7/00* (2006.01)

(52) U.S. Cl. .................. 707/705; 707/736; 707/790

(58) Field of Classification Search ............ 707/3, 100, 707/104.1, 10, 1, 5, 705, 736, 790, 999.104
See application file for complete search history.

(56) References Cited

U.S. PATENT DOCUMENTS

| | | | | |
|---|---|---|---|---|
| 4,959,811 A | * | 9/1990 | Szczepanek | 365/49.17 |
| 5,619,446 A | * | 4/1997 | Yoneda et al. | 365/49.18 |
| 5,805,816 A | | 9/1998 | Picazo, Jr. et al. | 395/200.53 |
| 5,886,988 A | | 3/1999 | Yun et al. | 370/329 |
| 5,893,121 A | * | 4/1999 | Ebrahim et al. | 1/1 |
| 6,072,772 A | | 6/2000 | Charny et al. | 370/229 |
| 6,148,307 A | * | 11/2000 | Burdick et al. | 1/1 |
| 6,169,992 B1 | * | 1/2001 | Beall et al. | 1/1 |
| 6,185,653 B1 | * | 2/2001 | Yanai et al. | 711/4 |
| 6,233,719 B1 | * | 5/2001 | Hardikar et al. | 700/110 |
| 6,513,043 B1 | * | 1/2003 | Chan et al. | 707/802 |
| 6,697,691 B1 | * | 2/2004 | Miller et al. | 700/108 |
| 6,741,978 B1 | * | 5/2004 | Rhoads et al. | 1/1 |
| 6,839,713 B1 | * | 1/2005 | Shi et al. | 707/101 |
| 6,871,112 B1 | * | 3/2005 | Coss et al. | 700/121 |
| 6,954,907 B2 | * | 10/2005 | Nakano et al. | 716/54 |
| 7,266,202 B1 | * | 9/2007 | Kawakami et al. | 380/283 |
| 2001/0044667 A1 | * | 11/2001 | Nakano et al. | 700/100 |
| 2002/0001619 A1 | * | 1/2002 | Goldenberg et al. | 424/484 |
| 2002/0032493 A1 | * | 3/2002 | Kadowaki et al. | 700/97 |
| 2002/0032691 A1 | * | 3/2002 | Rabii et al. | 707/200 |
| 2002/0046204 A1 | * | 4/2002 | Hayes | 707/1 |
| 2002/0062314 A1 | * | 5/2002 | Hisasue et al. | 707/10 |
| 2003/0004969 A1 | * | 1/2003 | Park et al. | 707/104.1 |

(Continued)

OTHER PUBLICATIONS

SEMI, SEMI E30-0307 Generic Model for Communications and Control of Manufacturing Equipment (GEM), pp. 76-77, 1992, 2007 (also available at www.semi.org).

(Continued)

*Primary Examiner* — Eliyah S Harper
(74) *Attorney, Agent, or Firm* — Rose Alyssa Keagy; Wade J. Brady, III; Frederick J. Telecky, Jr.

(57) ABSTRACT

A method for collecting data from semiconductor equipment includes selecting a plurality of data values to request from semiconductor equipment and assigning each of the data values to a chamber. Each chamber is associated with an engine that processes the data values in the associated chamber to detect a fault in the semiconductor equipment. The method also includes determining an order to receive the data values from the semiconductor equipment, and, after the order for the data values is determined, communicating a setup message requesting the semiconductor equipment to communicate the data values in the predetermined order. The method further includes receiving the data values from the semiconductor equipment and providing each of the received data values to the particular engine associated with the chamber of the data value.

17 Claims, 2 Drawing Sheets

U.S. PATENT DOCUMENTS

2003/0144986 A1* 7/2003 Ueno et al. .................. 707/1
2004/0001619 A1* 1/2004 Tai et al. .................. 382/141
2005/0055175 A1* 3/2005 Jahns et al. .................. 702/182
2006/0020577 A1* 1/2006 Oshima .................. 707/3

OTHER PUBLICATIONS

SEMI, SEMI E5-1106 SEMI Equipment Communications Standard 2 Message Content (SECS-II), pp. 131, 134-135, 1982, 2007 (also available at www.semi.org).

* cited by examiner

FIG. 3
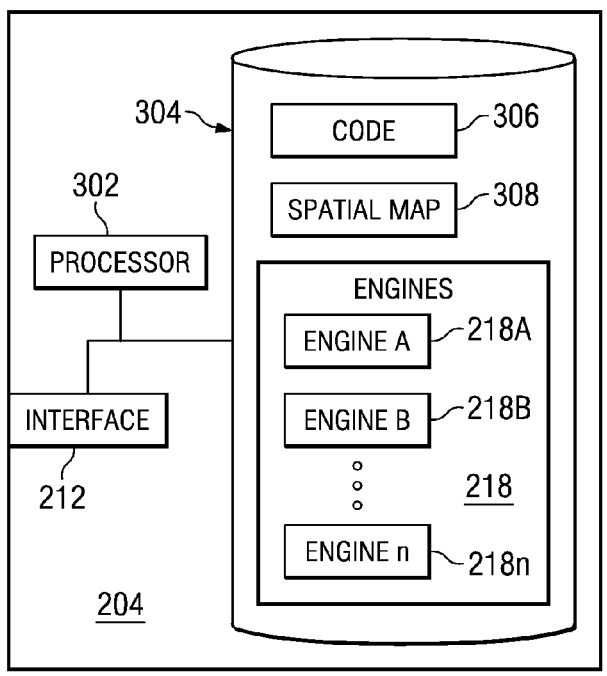
FIG. 4
| DATA IDENTIFIER | ENGINE |
|---|---|
| 1 | 1 |
| 2 | 1 |
| 3 | 1 |
| 4 | 1 |
| 5 | 1 |
| 6 | 1 |
| 7 | 1 |
| 8 | 1 |
| 9 | 1 |
| 10 | 1 |
| 11 | 2 |
| 12 | 2 |
| 13 | 2 |
| 14 | 2 |
| 15 | 2 |
| 16 | 2 |
| 17 | 2 |
| 18 | 2 |
| 19 | 2 |
| 20 | 2 |
| 21 | 3 |
| 22 | 3 |
| ⋮ | ⋮ |
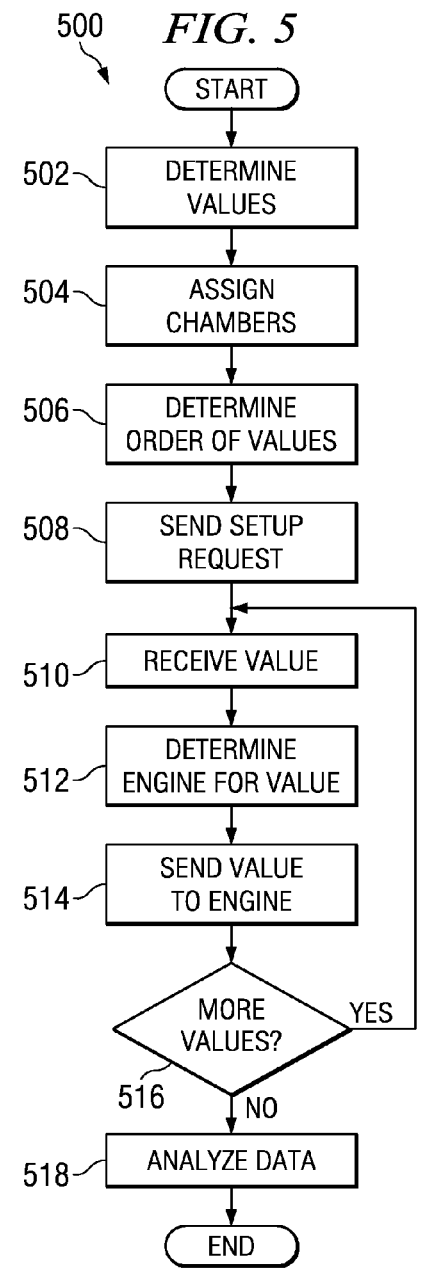
FIG. 5

METHOD FOR COLLECTING DATA FROM SEMICONDUCTOR EQUIPMENT

TECHNICAL FIELD OF THE INVENTION

This invention relates in general to semiconductor fabrication and more particularly to a method for collecting data from semiconductor equipment.

BACKGROUND OF THE INVENTION

During fabrication of semiconductor products, it is necessary to determine whether particular semiconductor equipment functioning properly. Often, this involves collecting a variety of diagnostic data from the semiconductor equipment, which can be analyzed to determine whether the equipment is functioning properly. In many cases, such semiconductor equipment can be include subsystems called "chambers." The chambers produce data values that are processed together to determine whether the semiconductor equipment is functioning properly. One method of collecting data is to establish separate connections between a data collector and semiconductor equipment for each chamber. However, there may be drawbacks associated with such data collection methods, including excessive use of bandwidth and inefficient use of packet space.

SUMMARY OF THE INVENTION

In a first embodiment, a method for collecting data from semiconductor equipment includes selecting data values to request from semiconductor equipment and assigning each of the data values to one of a plurality of chambers. Each chamber is associated with an engine that processes the data values in the associated chamber to detect a fault in the semiconductor equipment. The method also includes determining an order to receive the data values from the semiconductor equipment, and, after the order for the data values is determined, communicating a setup message requesting the semiconductor equipment to communicate the data values in the predetermined order. The method further includes receiving the data values from the semiconductor equipment and providing each of the received data values to the particular engine associated with the chamber of the data value.

In a second embodiment, a data analyzer includes a processor and an interface. The processor selects data values to request from semiconductor equipment and assigns each of the data values to a chamber. Each chamber is associated with an engine that processes the data values in the associated chamber to detect a fault in the semiconductor equipment. The processor also determines an order to receive the data values from the semiconductor equipment. The interface communicates a setup message to semiconductor equipment. The setup message causes the semiconductor equipment to communicate the data values to the data analyzer in a predetermined order. The interface also receives the data values from the semiconductor equipment. The processor provides each of the data values to the particular engine associated with the chamber of the data value.

Important technical advantages of certain embodiments of the present invention include improved use of bandwidth between data collectors and semiconductor equipment. One advantage of reducing the number of separate connections used to communicate data between semiconductor equipment and a data analyzer is that the amount of bandwidth used by the connection may be fixed. Accordingly, the reduced number of connections will not consume an excessive amount of bandwidth or underutilize available bandwidth. This prevents errors which may result from excessive delays in communication as well as improved efficiency for data collection.

Other important technical advantages of certain embodiments of the present invention include increased processing efficiency from multiple chambers. The present invention, in certain embodiments, uses multiple engines to process chambers separately. This allows increased efficiency and greater reliability in processing, but such embodiments also avoid several drawbacks associated with the use of engines, including inefficient use of bandwidth. Thus, certain embodiments of the present invention provide the advantages associated with multiple engines processing data from a particular device while avoiding drawbacks associated with multiple connections.

Other technical advantages of the present invention will be readily apparent to one skilled in the art from the following figures, description, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIG. 3 is an illustration of a particular embodiment of a data analyzer;

FIG. 4 is a spatial map that may be maintained at a data analyzer; and

FIG. 5 is a flowchart illustrating an example method of operation for a data analyzer.

DETAILED DESCRIPTION OF THE INVENTION

Figure 1:
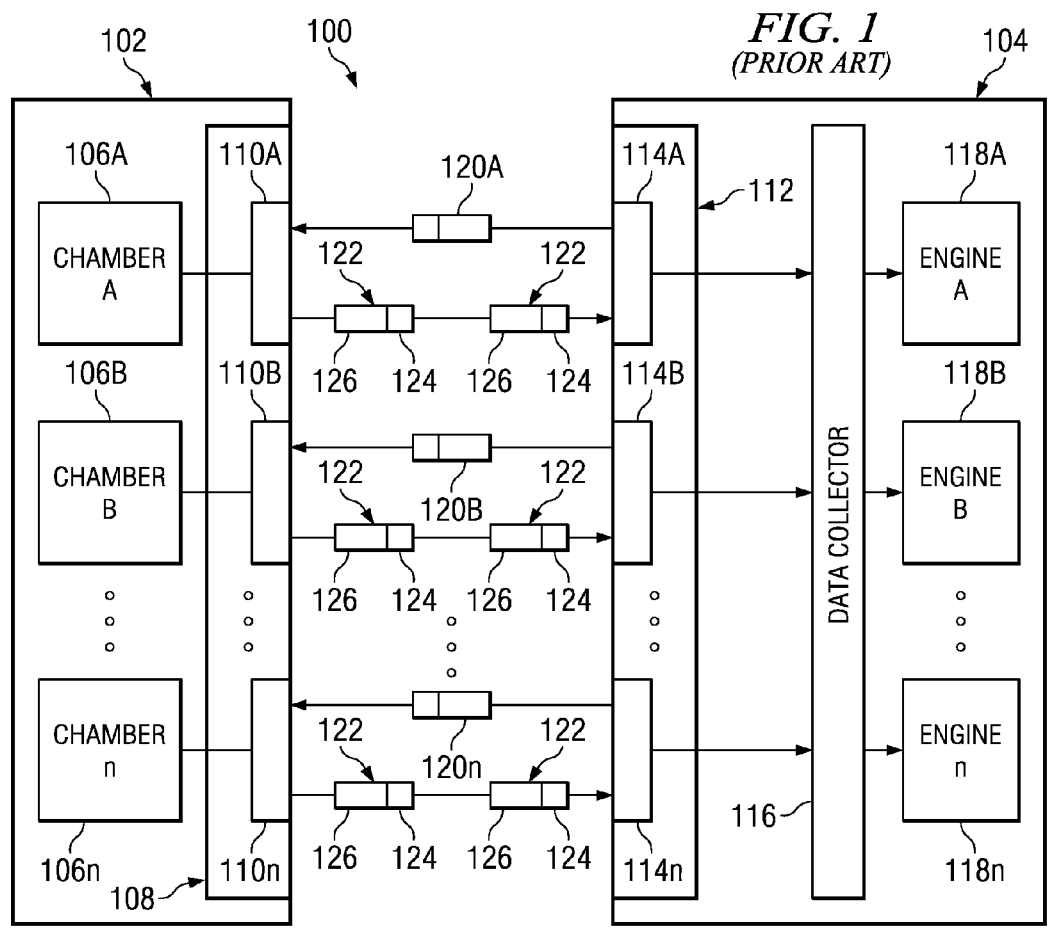
FIG. 1 illustrates a fault detection system for semiconductor equipment that establishes multiple connections between the semiconductor equipment and a data collector.

FIG. 1 illustrates a conventional fault detection system 100 in which a data analyzer 104 analyzes data received from several chambers 106 of semiconductor equipment 102. In the depicted embodiment, system 100 has multiple connections established between semiconductor equipment 102 and data analyzer 104. Data collector 116 receives information from a particular connection and forwards the information to the appropriate engine 118, which processes the data and determines whether semiconductor equipment 102 is functioning properly. As used in this specification, "chamber" refers to a grouping of subsystems, from which data values are collected that are analyzed by a particular engine.

Semiconductor equipment 102 represents any system including electrical and/or mechanical parts used in the manufacture of semiconductor products. Semiconductor equipment 102 may also produce data values indicative of the functioning of particular components of semiconductor equipment 102. Often, particular data values will need to be processed together in order to determine whether semiconductor equipment 102 is functioning properly. Accordingly, data values may be associated with chambers 106A, 106B, . . . , 106n (collectively referred to as "chambers 106"). Semiconductor equipment 102 communicates with data analyzer 104 using interface 108.

Interface 108 represents any physical means for forming connections to exchange information with data analyzer 104. Connections are illustrated as ports 110A, 110B, ..., 110n (collectively referred to as "connections 110"). Each connection 110 communicates the data values from its respective chamber 106 to data analyzer 104. Data is exchanged between semiconductor equipment 102 and data analyzer 104 in the form of packets 122. Each packet 122 includes header information 124 associated with the connection used to carry packet 122 and payload information 226, which is the information content of packet 122. In certain cases, there may not be less information in packet 122 than the capacity of payload 126, although partially-empty packets 122 generally require the same amount of header information 124.

In a particular embodiment, semiconductor equipment 102 and data analyzer 104 exchange information in a manner that conforms with the Semiconductor Equipment and Materials International (SEMI) standard, published by SEMATECH. According to the SEMI standard, a connection known as a "trace" may be established by data analyzer 104 sending setup messages 120A, 120B, ..., 120n (collectively referred to as "setup messages 120") to semiconductor equipment 102. Each setup message 120 includes a trace identifier and a list of variables. Semiconductor equipment 102 responds by sending data values to data analyzer 104 in the order provided in setup message 120.

Data analyzer 104 represents a collection of components, whether hardware or software, that collect information from semiconductor equipment 102 and analyzes information to determine whether a fault has taken place in the operation of semiconductor equipment 102. In the depicted embodiment, data analyzer 104 includes an interface 112, a data collector 116, and engines 118A, 118B, ..., 118n (collectively referred to as "engines 118"). Interface 112 is a physical communication connection that establishes multiple logical connections with semiconductor equipment 102, illustrated as ports 114A, 114B, ..., 114n (collectively referred to as "connections 114"). Data analyzer 104 also includes a data collector 116. Data collector 116 receives information from connections 114 and communicates the information to engines 118 based upon the connection 114 from which the information was received. Engines 118 perform a suitable form of data analysis to determine whether a particular component or components of semiconductor equipment 102 are functioning properly.

In operation, data analyzer 104 establishes connections with semiconductor equipment 102 by sending setup messages 120. Each setup message 120 includes a trace identifier and a list of variables that semiconductor equipment 102 is to provide. Semiconductor equipment 102 provides the requested information, corresponding to chambers 106, using the particular connection 110 established by setup message 120. The information communicated from semiconductor equipment 102 using a particular connection 110 will be identified with the trace identifier that was sent in setup message 120. Accordingly, the values associated with each chamber 106 are communicated on the corresponding connection 110. Data collector 116 receives information from connections 114 and forwards information to the appropriate engine 118.

Drawbacks associated with system 100 include under-utilization of payloads 122 of packets 126. Since each chamber may require a relatively small number of variables, connections between data analyzer 104 and semiconductor equipment 102 may carry less information that the connection might otherwise support. This leads to less efficient use of network resources. Another drawback is that the communication rate between semiconductor equipment 102 and data analyzer 104 may be variable. The variable rate may grow above the available bandwidth or violate other information constraints. This may introduce delays in communication, which may cause data analyzer 104 to determine that a fault has taken place simply because information has not arrived in sufficient time. These drawbacks may significantly impair the efficiency and accuracy of fault detection system 100.

Figure 2:
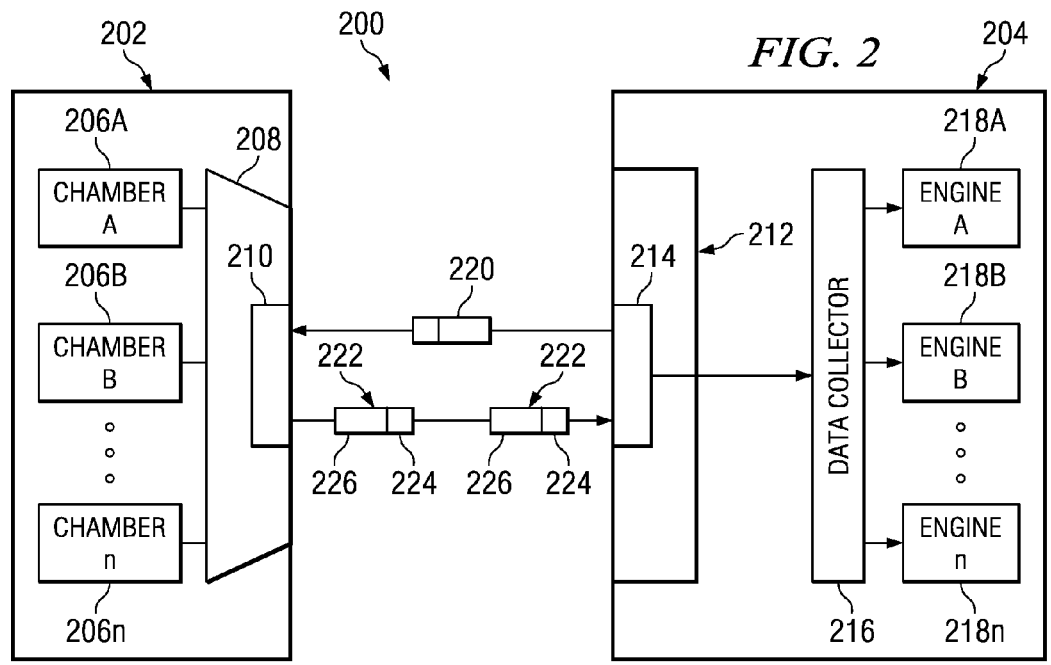
FIG. 2 illustrates a fault detection system that analyzes data using a single connection between semiconductor equipment and a data analysis device.

FIG. 2 illustrates an improved fault detection system 110 in which a data analyzer 204 analyzes semiconductor equipment 202. As in FIG. 1, semiconductor equipment 202 produces data values that are associated with chambers 206A, 206B, ..., 206n (collectively referred to as "chambers 206"). This information is collected by data collector 216 which forwards the information to engines 218A, 218B, ..., 218n (collectively referred to as "engines 218"). But in contrast to conventional fault detection system 100, fault detection system 200 uses interfaces 208 and 212 to establish a single connection between semiconductor equipment 202 and data analyzer 204. The single connection is shown between ports 210 and 214. Data collector 216 forwards the information to engines 218 based on the order in which information is received from semiconductor equipment 202, rather than by connection. This allows semiconductor equipment 202 to maintain a more constant flow of information, decreasing the likelihood of partially-empty payloads 226 in packets 222, which in turn reduces the overall amount of header information 224 required to communicate the requested information between semiconductor equipment 202 and data analyzer 204. It also exploits the natural rate of data communication of semiconductor equipment 202 to regulate bandwidth use.

In operation, data analyzer 204 communicates a setup message 220 to semiconductor equipment 202 using connection 214. Setup message 220 includes an identifier for the connection and a list of variables to be provided by semiconductor equipment 202. Semiconductor equipment 202 returns the information in the order provided in the list of setup message 220. Information is communicated sequentially using connection 210. Data collector 216 receives the information from the connection, and based on the order specified in setup message 220, data collector 216 determines the appropriate engine 218 to which a particular piece of information should be forwarded. Thus, data collector 216 permits the use of multiple engines 218, but also regulates the amount of bandwidth used by semiconductor equipment 202 to communicate information to data analyzer 204 using connection 210. Advantages of the particular embodiment depicted include improved bandwidth efficiency and improved accuracy resulting from reducing excessive delays in communication of information between semiconductor equipment 202 and data analyzer 204.

FIG. 3 illustrates data analyzer 204 in a particular embodiment. In the depicted embodiment, data analyzer 204 includes interface 212, a processor 302, and a memory 304. Processor 302 represents any component, whether software or hardware, that processes information to perform tasks of data analyzer 204, such as the tasks performed by data collector 216 and/or engines 218. Memory 304 represents any suitable form of information storage, which may include magnetic media, optical media, removable media, local storage, remote storage, or any other suitable information storage medium. Although a particular embodiment of data analyzer 204 is illustrated, it should be understood that the particular components illustrated may have their respective functions distributed among several components or consolidated within shared components without significantly disturbing the operation of data analyzer 204.

In the depicted embodiment, memory 304 stores code 306 executed by a processor to perform various tasks of data analyzer 204. Memory 304 also stores engines 218, which are particular algorithms or software routines executed by processor 302 to analyze data received from semiconductor equipment 202. Based on this analysis, it can be determined whether semiconductor equipment 202 is functioning properly. Memory 304 also stores a spatial map 308. Spatial map 308 represents any suitable table, database, or other arrangement or format of information that associates particular data values with the particular engine 218 processing the data values. Thus, for example, a particular piece of data identified by a number may be associated with a particular engine. When requesting data, data analyzer 204 may format setup request 220 to cause semiconductor equipment 202 to send the data in a specified order. Based on the order in which the information is received, data analyzer 204 may determine based on spatial map 308 the particular engine 218 to which the data value is to be forwarded.

FIG. 4 illustrates an example of spatial map 400 that may be maintained by data analyzer 204. In the depicted embodiment, spatial map 400 lists data values by a location 402 in the order that they will be received by data analyzer 204. For each location 402, there is an associated engine 404. Thus, when data analyzer 204 receives each data value in the sequence, data analyzer 204 may determine the associated engine 404 for that data value. This allows data analyzer 204 to communicate the data value to the associated engine 404.

FIG. 5 is a flow chart 500 illustrating an example method for collecting data from semiconductor equipment. Data analyzer 204 determines a set of data values to be analyzed by engines 218 at step 502, and assigns each value that correspond to one of the engines 218 to a particular chamber 206 associated with that engine 218 at step 504. Data analyzer 204 then determines an order in which to receive the values at step 506. The predetermined order is used to generate setup message 220, which is communicated to semiconductor equipment 202 at step 508. Setup message 220 includes a connection identifier and a list of requested variables in the predetermined order.

Semiconductor equipment 202 responds to setup message 220 by communicating data values to data analyzer 204. Data collector 216 receives a data value at step 510. Based on the order in which a particular data value is received, data collector 216 determines a corresponding engine 218 for the data value at step 512. Data collector 216 then communicates the data value to the corresponding engine 218 at step 514. If there are more values received, data collector 216 repeats steps 510 through 514 until all data value are communicated to the respective engines 218, as shown in decision step 516. Once the data values are collected, engines 218 may analyze the data to determine if there is fault in semiconductor equipment 202 at step 518. Alternatively, each individual engine 218 may begin analyzing data once all of the data values required by that engine 218 are collected, whether or not all of the other engines 218 have collected their respective data values. In such an embodiment, engines 218 may be arranged in a particular order, so that, for example, engines 218 that require the more time to process data would receive their respective data values first.

The particular method described is only one example of a method for data collection, and data analyzer 204 could potentially employ numerous other methods of data collection. Generally, data analyzer 204 uses any suitable method of data collection that allows data analyzer 204 to distinguish between data values from multiple chambers 206 received over the same connection between semiconductor equipment 202 and data analyzer 204. For example, an alternative method could include receiving data from semiconductor equipment 202 using multiple connections with each connection associated with multiple chambers. Consequently, it should be understood that data analyzer 204 may use any such method consistent with any of the embodiments described above.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for collecting data from semiconductor equipment, comprising:
    selecting a plurality of data values associated with a plurality of chambers to request from semiconductor equipment having the plurality of chambers;
    assigning each of the data values to one of the plurality of chambers, wherein each chamber is associated with one of a plurality of engines that processes the data values of the associated chamber to detect a fault in the semiconductor equipment;
    determining an order to receive the data values from the semiconductor equipment;
    after the order for the data values is determined, communicating a setup message requesting the semiconductor equipment to communicate the data values in the predetermined order;
    receiving the data values from the semiconductor equipment; and
    providing each of the received data values to the particular engine associated with the chamber communicating the data value;
    wherein all of the data values are communicated from the semiconductor equipment using a single packet.

2. The method of claim 1, wherein determining an order comprises:
    selecting an order for the chambers; and
    determining the order for the data values based on the order for the chambers such that all of the data values for a particular chamber will be received before any of the data values for the next chamber.

3. The method of claim 1, further comprising:
    analyzing the data values using the engines; and
    detecting a fault in the semiconductor equipment based on the analysis.

4. The method of claim 3, wherein the step of analyzing is commenced separately at each engine in response to all of the data values for a particular chamber associated with the engine being provided to the engine.

5. The method of claim 1, wherein:
    the semiconductor equipment exchanges information using a SEMI interface; and
    the setup message comprises:
        a trace identifier; and
        a list of the requested data values in the order the data values are to be received.

6. The method of claim 1, wherein:
    the semiconductor equipment communicates the data values using a physical connection, the physical connection having a maximum bandwidth; and
    the order of the data values is determined at least in part based upon the maximum bandwidth of the connection.

7. The method of claim 6, wherein the order of the data values is further determined based on a maximum output rate of the semiconductor equipment.

8. The method of claim 1, wherein the order of the data values is determined at least in part based on an amount of bandwidth required to communicate each data value.

9. The method of claim 1, wherein the order of the data values is selected such that all of the data values in a particular chamber will arrive within a predetermined time of one another.

10. A data analyzer, comprising:
a processor operable to:
    select a plurality of data values associated with a plurality of chambers to request from semiconductor equipment having the plurality of chambers;
    assign each of the data values to one of the plurality of chambers, wherein each chamber is associated with one of a plurality of engines that processes the data values of the associated chamber to detect a fault in the semiconductor equipment; and
    determine an order to receive the data values from the semiconductor equipment; and
an interface operable to:
    communicate a setup message to semiconductor equipment, the setup message operable to cause the semiconductor equipment to communicate the data values to the data analyzer in the predetermined order; and
    receive the plurality of data values from the semiconductor equipment, wherein the processor is further operable to provide each of the data values to the particular engine associated with the chamber;
wherein all of the data values are communicated from the semiconductor equipment to the data analyzer using a single packet.

11. The data analyzer of claim 10, wherein the processor is further operable to:
select an order for the chambers; and
determine the order for the data values based on the order for the chambers such that all of the data values for a particular chamber will be received before any of the data values for the next chamber.

12. The data analyzer of claim 10, further comprising the engines, the engines operable to analyze the data values and further operable to detect a fault in the semiconductor equipment based on the analysis.

13. The data analyzer of claim 12, wherein:
each engine is operable to commence analyzing the data values for a chamber associated with the engine separately from the other engines; and
each engine commences analyzing the data values for the associated chamber in response to being provided with all of the data values in the associated chamber.

14. The data analyzer of claim 10, wherein:
the semiconductor equipment exchanges information with the data analyzer using a SEMI interface; and
the setup message comprises:
    a trace identifier; and
        a list of the requested data values in the order the data values are to be received.

15. The data analyzer of claim 10, wherein:
the semiconductor equipment and the data analyzer are coupled by a physical connection, the physical connection having a maximum bandwidth; and
the order of the data values is determined at least in part based upon the maximum bandwidth of the connection.

16. The data analyzer of claim 10, wherein the order of the data values is further determined based on a maximum output rate of the semiconductor equipment.

17. The data analyzer of claim 10, wherein the order of the data values is determined at least in part based on an amount of bandwidth required to communicate each data value.

* * * * *